(12) United States Patent
Walburger et al.

(10) Patent No.: US 6,597,240 B1
(45) Date of Patent: Jul. 22, 2003

(54) CIRCUITS AND METHODS FOR SLEW RATE CONTROL AND CURRENT LIMITING IN SWITCH-MODE SYSTEMS

(75) Inventors: Eric Walburger, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 54 days.

(21) Appl. No.: 09/825,443

(22) Filed: Apr. 2, 2001

(51) Int. Cl.[7] .................................................. H03F 3/38
(52) U.S. Cl. ....................... 330/10; 330/207 P; 330/251
(58) Field of Search ............................ 330/10, 207 P, 330/251

(56) References Cited

U.S. PATENT DOCUMENTS

| | | | | | |
|---|---|---|---|---|---|
| 4,337,438 A | * | 6/1982 | Guggenbuhl et al. | ......... | 330/10 |
| 4,673,889 A | * | 6/1987 | Cini et al. | ................... | 330/10 |
| 5,077,539 A | * | 12/1991 | Howatt | ......................... | 330/10 |
| 5,617,058 A | * | 4/1997 | Adrian et al. | .................. | 330/10 |
| 5,805,020 A | * | 9/1998 | Danz et al. | ..................... | 330/10 |
| 5,963,086 A | * | 10/1999 | Hall | ............................... | 330/10 |
| 6,005,316 A | * | 12/1999 | Harris | ......................... | 310/90.5 |
| 6,034,565 A | * | 3/2000 | Schweighofer | ............... | 330/10 |
| 6,118,336 A | * | 9/2000 | Pullen et al. | .................. | 330/10 |
| 6,297,693 B1 | * | 10/2001 | Pullen | ........................... | 330/10 |
| 6,313,697 B1 | * | 11/2001 | Neuteboom et al. | .......... | 330/10 |

* cited by examiner

*Primary Examiner*—Michael Tokar
*Assistant Examiner*—Khai M. Nguyen
(74) *Attorney, Agent, or Firm*—Barry S. Newberger; Winstead Sechrest & Minick P.C.; Steven Lin

(57) ABSTRACT

An apparatus and method for limiting the output current in a switched mode amplifier are implemented. The apparatus includes a driver amplifier configurable for selective operation in one of three modes. The amplifier is operable for transitioning between the first mode and one of the second and third modes in response to a state of an output node of the driver. Bias circuitry, configurable for selective coupling to the driver amplifier is operable for limiting the output current of the amplifier in the first operating mode.

33 Claims, 8 Drawing Sheets

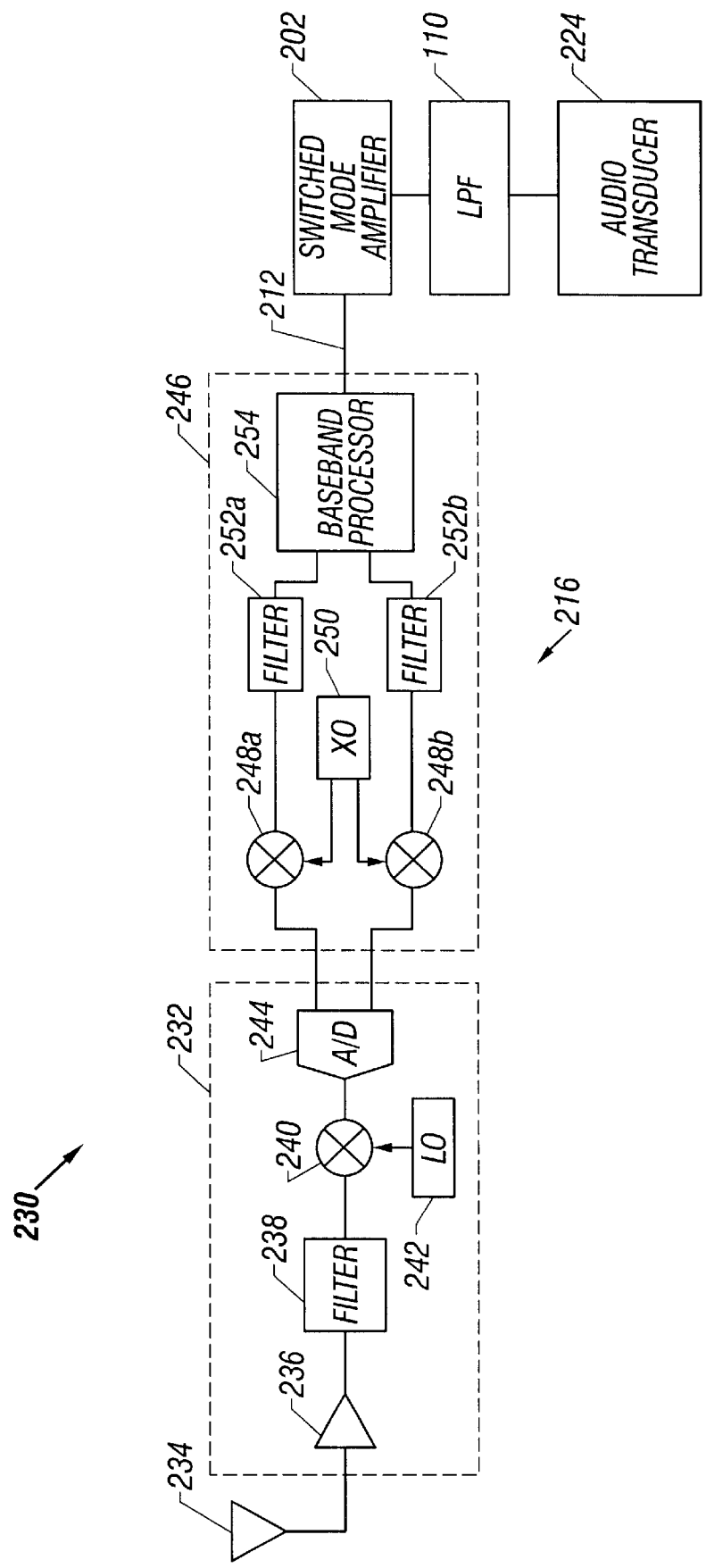
FIG. 2.1

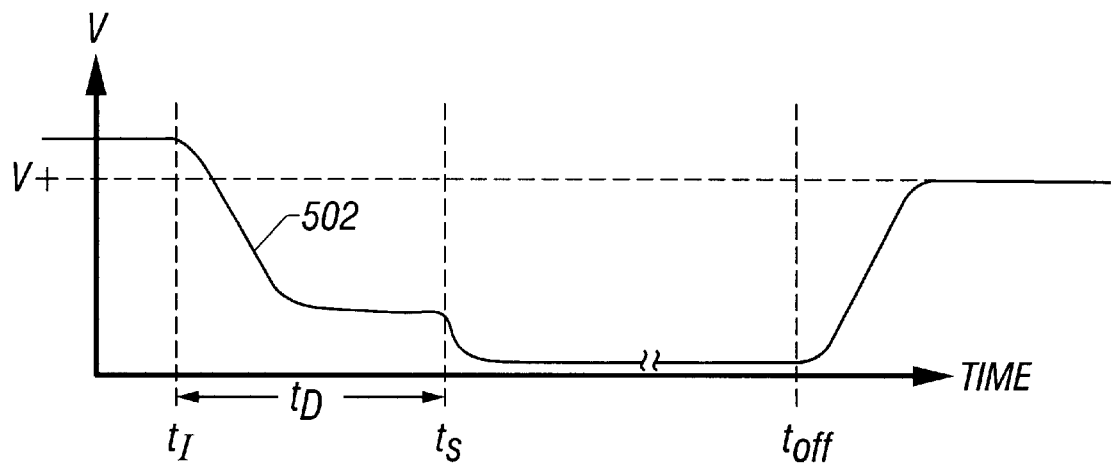
FIG. 5.1
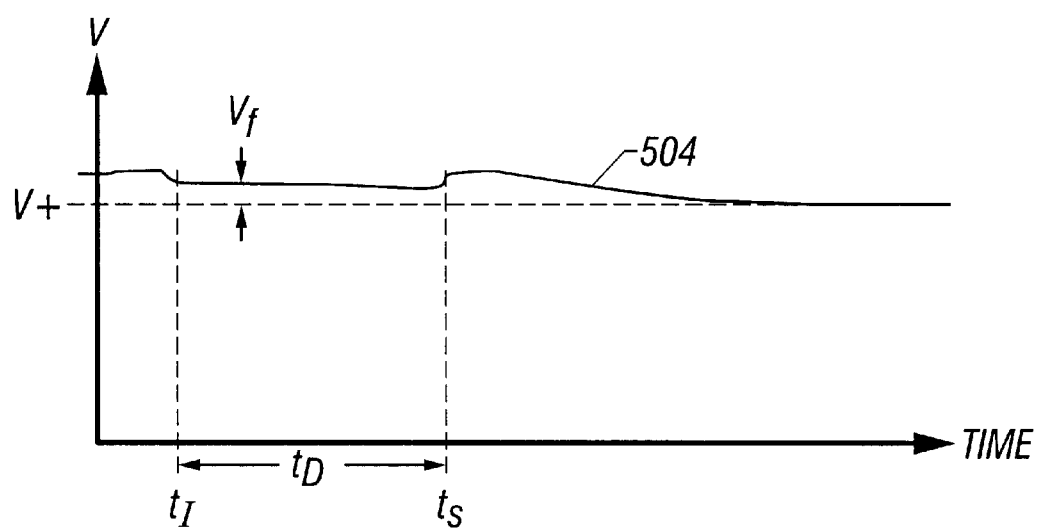
FIG. 5.2

CIRCUITS AND METHODS FOR SLEW RATE CONTROL AND CURRENT LIMITING IN SWITCH-MODE SYSTEMS

BACKGROUND OF THE INVENTION

1. Field of the Invention

The present invention relates in general to switched mode amplifier systems, and in particular to circuits and methods for current limiting under fault conditions, and slew rate control in switched mode amplifier systems.

2. Description of the Related Art

Class D audio power amplifiers (APAs) have been used for many years in systems, such as wireline telephony, where high bandwidth is not critical. More recently however, new fabrication techniques, and in particular, new techniques for fabricating power transistors, have made integrated class D APAs possible. This has extended their potential applications to lower-power, higher-bandwidth systems, including battery-powered portable music players and wireless communications devices.

One major advantage of class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above ninety percent (90%). In contrast, the typical class AB push-pull amplifier, using output transistors whose conduction varies linearly during each half-cycle, has an efficiency of around sixty percent (60%). The increased efficiency of class D amplifiers in turn reduces power consumption and consequently lowers heat dissipation and improves battery life in portable systems.

As previously described, in a class D amplifier, efficiency is gained by switching the power devices hard between the power supply rails. The high frequency noise is then filtered with a low pass filter. Typically, the low pass filter is of the passive type, including inductive and/or capacitive reactive elements to smooth the signal. FIG. 1 illustrates, in block diagram form, a typical class D amplifier system 100. Amplifier system 100 includes class D amplifier 102 containing MOSFET switch 104 and PWM controller 106. PWM controller 106 receives a digitized audio input signal, which constitutes the signal to be amplified. MOSFET switch 104 may constitute a full bridge amplifier. The duty cycle of the PWM signal is proportional to the (quantized) amplitude of the audio signal. In other words, for each sample period, the relative time duration of the "high" and "low" levels of the PWM signal into MOSFET switch 106 are proportional to the quantized amplitude of the audio signal, and consequently the relative time intervals during which the output of the amplifier, ahead of LPF 110, is pulled up and pulled down is similarly proportional to the audio signal amplitude. In the subsequent discussion of a switched mode amplifier according to the principles of the present invention, the time interval within a sample period during which the PWM data is "high" and the output of the MOSFET switch (which may also be referred to as a driver) pulled up will be called the "high" phase, and conversely, the interval during which the PWM data is "low", and the output concomitantly pulled down, will be referred to as the "low" phase. The amplified audio is recovered via low pass filter (LPF) 110, which provides the audio output to a load, Z.

System 100 provides overcurrent protection via a series resistance in the audio path. A short circuit or overload current is detected by monitoring the voltage across current limiting resistor 112. This voltage is fed back to PWM controller/driver 106. If the voltage across resistor 112 exceeds a predetermined threshold for a time interval that exceeds a predetermined length, PWM controller/driver 106 turns off the output transistors constituting switch 104. The presence of current limiting resistor 112 increases the inefficiency of system 100 as power is lost in the device, and moreover, the voltage across resistor 112 is difficult to detect in that resistor 112 is typically offset from ground, and the logic in PWM controller/driver 106 that detects the voltage across resistor 112 requires substantial common mode rejection.

SUMMARY OF THE INVENTION

According to the principles of the present invention, switched-mode amplifier current control apparatus is disclosed that includes a driver amplifier selectively configurable for operating in a first, second and third operating mode. Bias circuitry operable for limiting an output current of the driver amplifier is configured for selective coupling to the amplifier in the first operating mode. The driver amplifier is operable for transitioning from the first operating mode to a selected one of the second and third operating modes in response to a state of an output node of said driver amplifier.

The inventive concept addresses a problem in switched-mode drivers, namely, overcurrent detection and protection. Conventional switched-mode amplifiers employ a series resistance in the output node of the driver, and detect an overcurrent condition by monitoring the drop across the resistance. Power lost in the resistance decreases efficiency of the amplifier, and the offset of the resistance from ground complicates the measurement of the drop across the resistance. The bias circuitry limits the output current of the driver amplifier in the first operating mode. In accordance with a state of an output node of the driver amplifier, the amplifier is operable for transitioning to a selected one of the first and second operating modes.

BRIEF DESCRIPTION OF THE DRAWINGS

For a more complete understanding of the present invention, and the advantages thereof, reference is now made to the following descriptions taken in conjunction with the accompanying drawings, in which:

FIG. 2.1 illustrates, in block diagram form, a digital receiver embodying the principles of the present invention;

FIGS. 5.1 and 5.2 illustrate output signal waveforms from an amplifier switch in accordance with a switched mode amplifier embodying the principles of the present invention;

DETAILED DESCRIPTION

Figure 1:
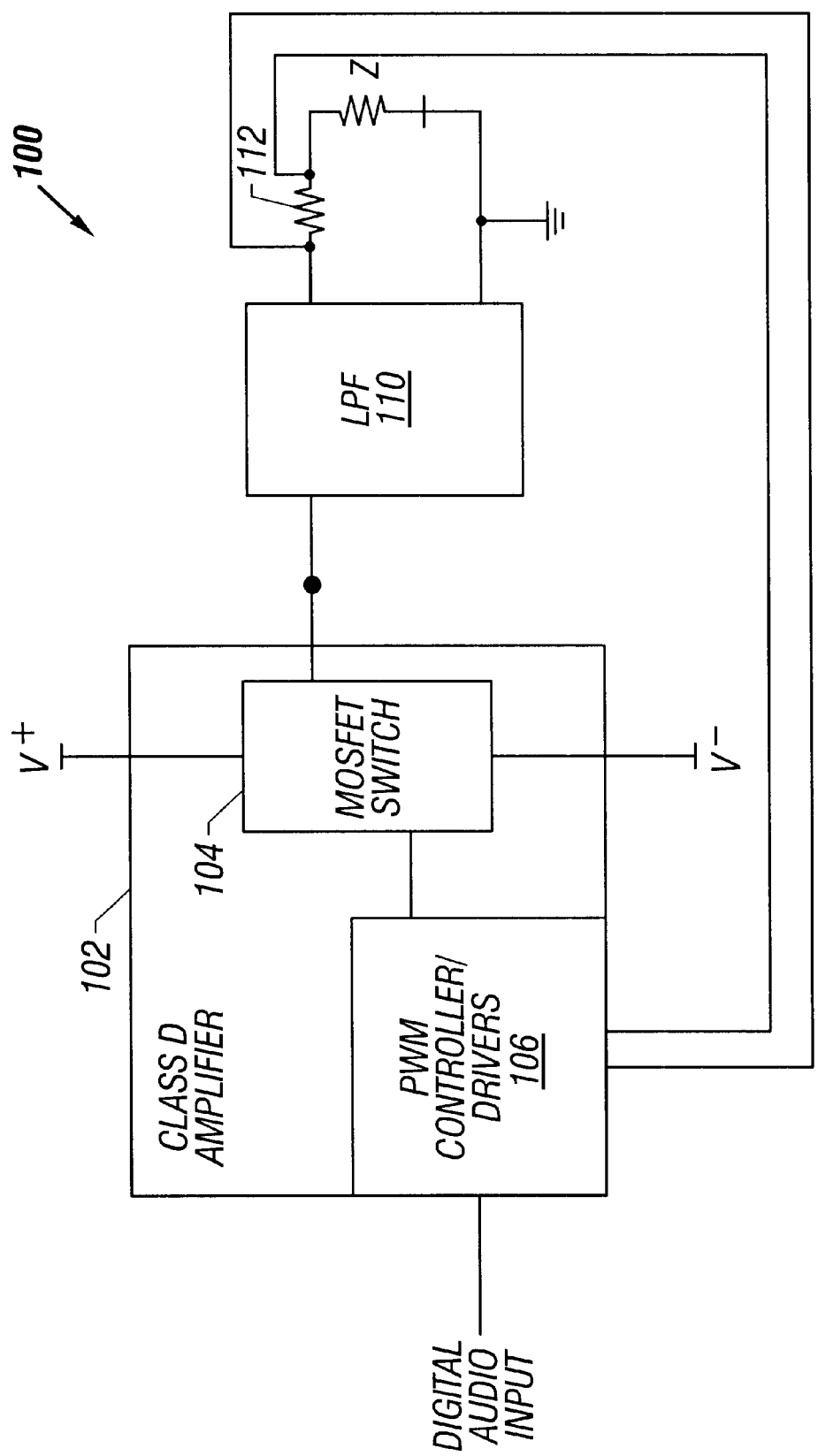
FIG. 1 illustrates, in block diagram form, a switching amplifier system in accordance with the prior art.

In the following description, numerous specific details are set forth, such as specific transistor size ratios, current source strengths, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
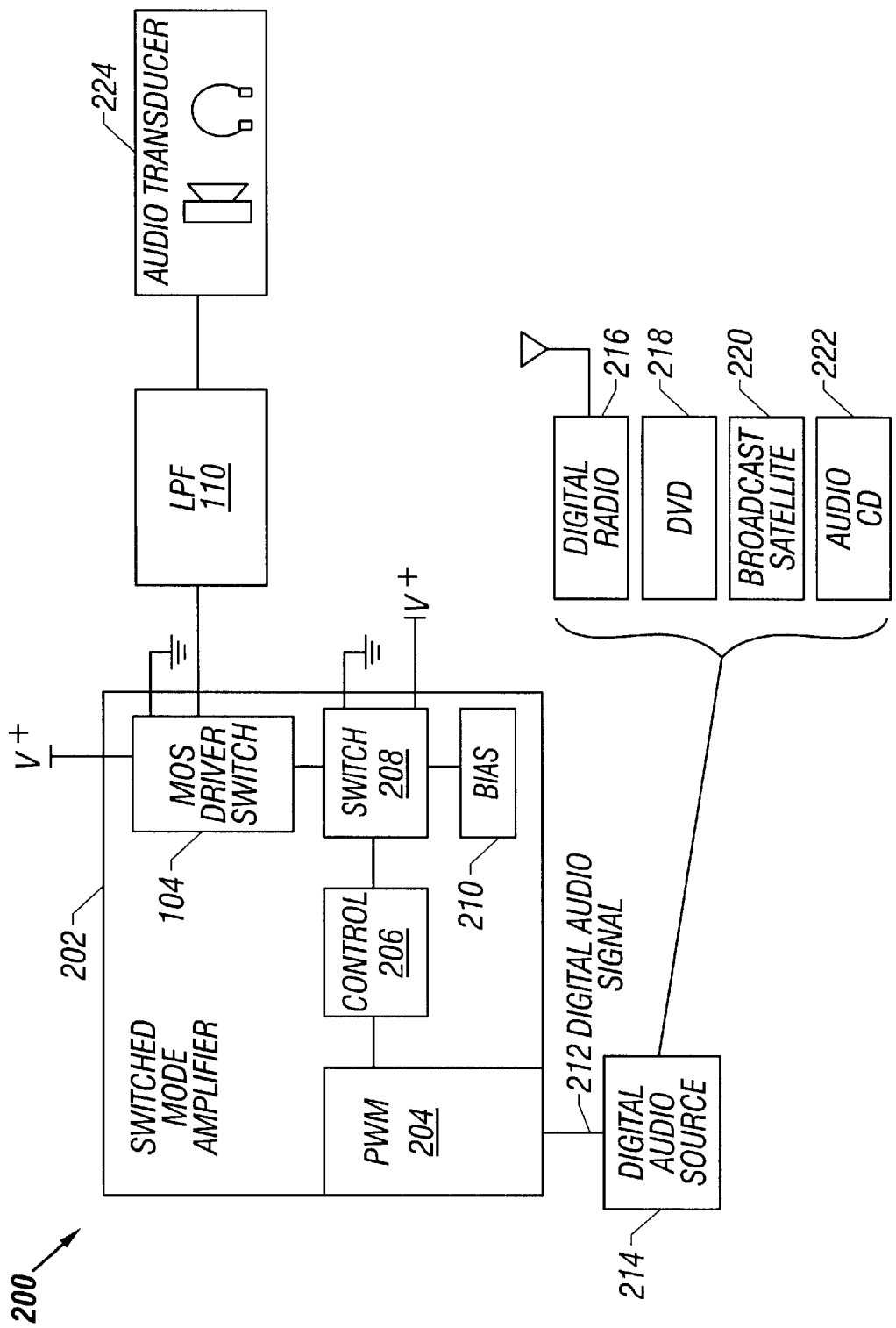
FIG. 2 illustrates, in block diagram form, a audio system in accordance with an embodiment of the present invention.

Refer now to FIG. 2 illustrating an audio system 200 in accordance with the principles of the present invention. Amplifier 202 includes, in addition to MOSFET switch 104, pulse-width modulator (PWM) 204, control unit 206, switch 208 and bias unit 210. A digital audio signal 212, which may be a conventional pulse code modulated (PCM) digital representation of an analog audio signal is provided to PWM 204 by digital audio source 214. The digital audio source may include one or more of a digital radio 216 digital video disk (DVD) player 218, direct broadcast satellite 220, or audio compact disk (CD) 222.

FIG. 2.1 illustrates, in further detail, a digital radio system 230 embodying the principles of the present invention. FIG. 2.1 is a functional block diagram of one channel of a digital radio 230 embodying the principles of the present invention. Digital radio 230 includes an analog section or front-end 232 which receives radio frequency (RF) signals from an associated antenna 234. Analog front-end 232 is preferably a conventional RF down-converter including a low noise amplifier (LNA) 236 for setting the system noise figure, a bandpass filter 238 and mixer 240 driven by an analog local oscillator 242. The mixed-down analog signal is then converted into digital form by analog to digital converter 244.

The digitized data output from A/D converter 244 is passed to digital processing section 246. A pair of mixers 248a,b generate in-phase (I) and quadrature (Q) signals from a corresponding pair of clock phases from crystal oscillator 250. The I and Q signals are next passed through bandpass filters 252a and 252b and on to digital baseband processor 254. The processed digital signal is then re-converted to analog (audio) form via switched mode (Class D) audio power amplifier (APA) 202, discussed in detail below, which s used to drive audio transducer 224 such as an external set of speakers or a headset through LPF 110.

Figure 3:
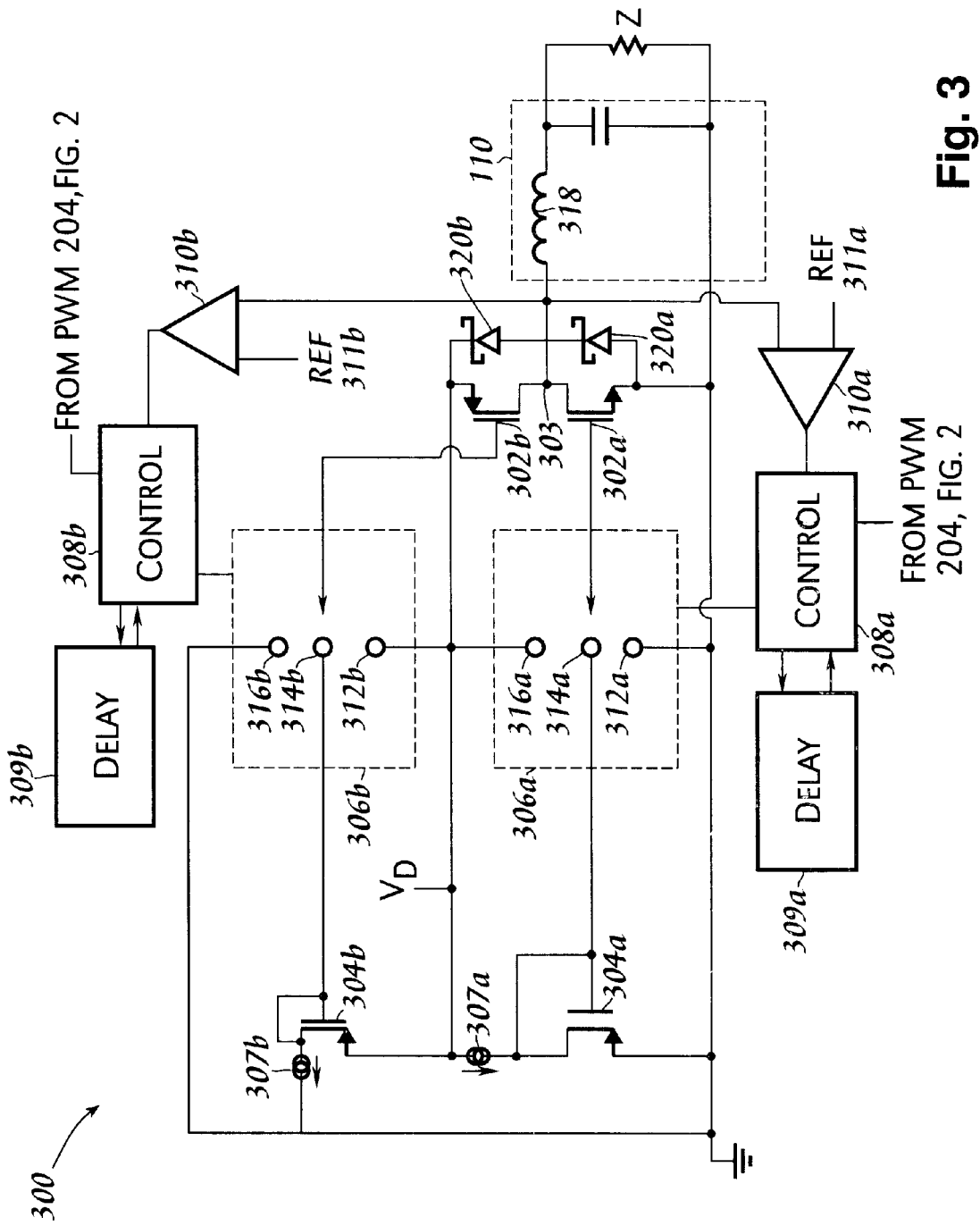
FIG. 3 illustrates, in partial schematic form, a portion of a switching amplifier in accordance with an embodiment of the present invention.

FIG. 3 illustrates a portion 300 of amplifier 202, FIG. 2, in further detail. Portion 300 includes complementary MOSFETs 302a and 302b. The output of the amplifier is provided at the output or common node 303 of the drains of transistors 302a and 302b. The sources of transistors 302a and 302b are connected between the supply rails, $V_D$ and ground in FIG. 3.

MOSFETs 304a and 304b and the associated current sources, 306a and 306b bias networks for transistors 302a and 302b, respectively. Transistors 304a and 304b are diode connected devices, and are biased in the saturation region of the source-drain characteristic by current sources 306a and 306b, respectively. The corresponding gates of transistors 302a and 302b are connected, via switches 306a and 306b, respectively, to the gates of transistors 304a and 304b. Thus, when the gates of transistors 302a and 304a are connected via switch 306a, the transistor pair forms a current mirror. Likewise, when the gates of transistors 302b and 304b are coupled via switch 306b, the transistor pair forms a current mirror. Transistors 304a and 304b may be referred to as mirror reference transistors.

Switches 306a and 306b couple the gates of transistors 302a and 302b, respectively, to one of the supply rails, or to the gates of transistors 304a and 304b. Switches 306a and 306b switch between the supply rails and gates of transistors 304a and 304b under the control of corresponding ones of controls 308a and 308b. The operation of switches 306a and 306b, and concomitantly, controls 308a and 308b will be discussed in further detail in conjunction with FIG. 4. Controls 308a and 308b detect an overcurrent condition and responds to an output from comparators 310a and 310b respectively. It would be understood by artisans of ordinary skill that control 308a and 308b are shown as separate blocks for illustrative purposes, and that these controls may, in an alternative embodiment, be implemented in a single logical unit. Likewise, comparators 310a and 310b, illustratively shown as separate blocks, may also be, alternatively, implemented as a single logical unit, and moreover, may be incorporated into controls 308a and 308b. Additionally, controls 308a and 308b receive the PWM driving signal from the pulse-width modulator, for example PWM 204, FIG. 2. Controls 308a and 308b, together with comparators 310a and 310b may perform portions of the driver process discussed in conjunction with FIG. 4.

Figure 4:
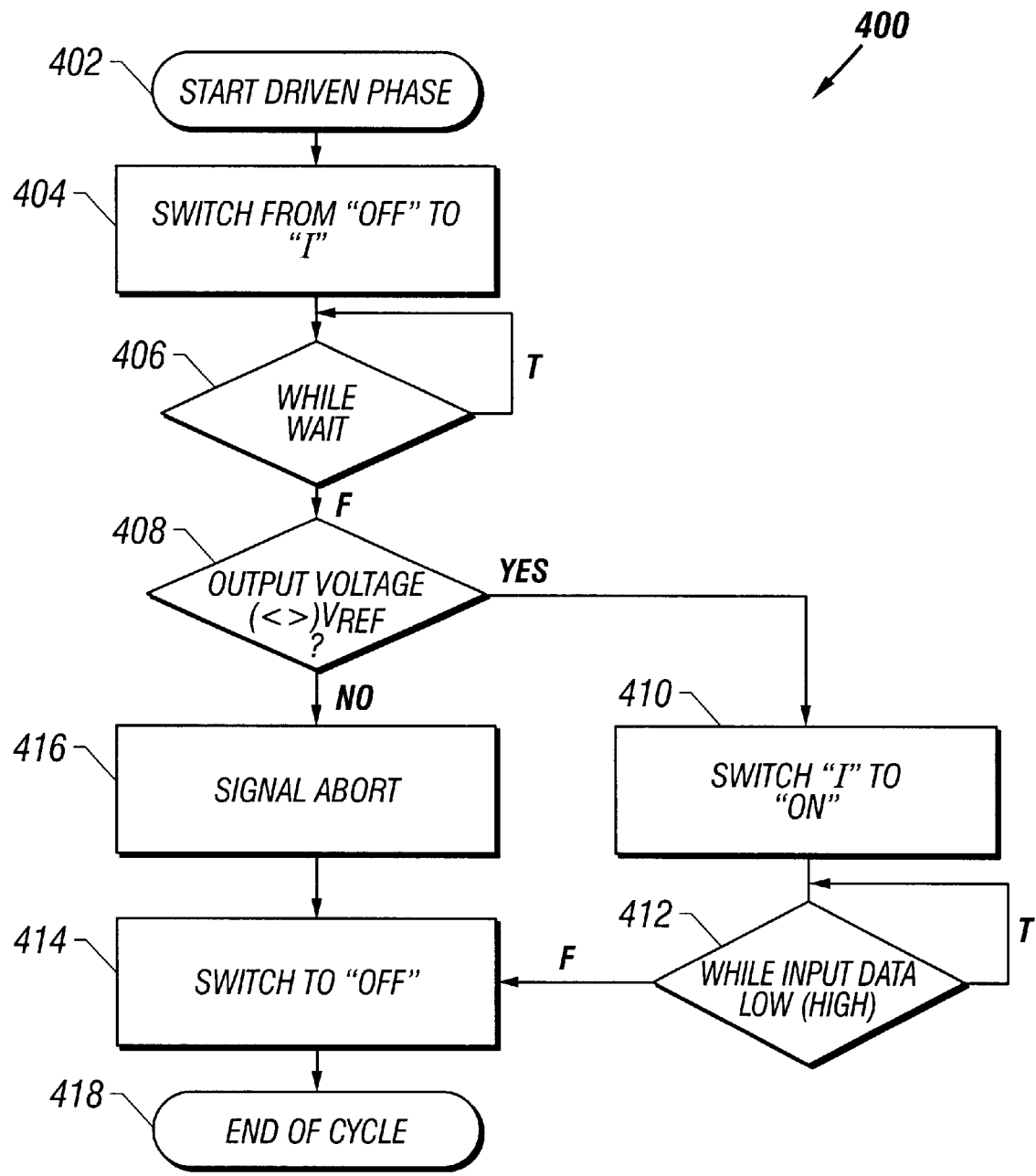
FIG. 4 illustrates, in flow chart form, a driving process in accordance with another embodiment of the present invention.

The operation of amplifier portion 300 may be understood by referring now to FIG. 4. FIG. 4 illustrates, in flowchart form, a driver process in accordance with the principles of the present invention. As previously discussed, switched mode amplifiers switch the power devices, transistors 302a and 302b in FIG. 3, between the supply rails, and the audio signal is recovered from the output, formed by the common drains of the transistors, by a low pass filter. During a data "high" input, the common node (node 303 in FIG. 3) is pulled up, toward the positive supply rail. Conversely, for a "low" data input, the common node is pulled toward the negative supply rail. In a switched mode amplifier in accordance with amplifier 300, FIG. 3, common node 303 is pulled up by transistor 302b, and down by transistor 302a. Transistors 302a and 302b, FIG. 3, may be driven in accordance with process 400, FIG. 4. As previously discussed, an input signal to a switched mode amplifier is a digital representation of the analog input which is provided to a pulse-width modulator (for example, PWM 204, FIG. 2). The output of the pulse-width modulator establishes a duty cycle for the switching of one of the driver transistors, such as transistors 302a and 302b in FIG. 3, depending on the value ("high" or "low") of the input data. In other words, process 400 may be performed by a corresponding one of control 308a and switch 306a, and control 308b and switch 306b during the "high" portion of the pulse-width-modulated signal, and the low portion of the pulse-width-modulated signal, respectively. At the start of driven phase corresponding to the state of the input PWM signal, "high" or "low", in step 402, the corresponding one of switch 306a and 306b is switched from a high impedance mode, or "off", state corresponding to one of switch states 312a and 312b, to "I", switch state 314a or 314b, depending on the input data value. (Note that the complementary transistor may be switched by its corresponding control from a low impedance mode, or "on" state to "off", which operation corresponds to steps 408 and 410, discussed below.) In an embodiment of the present invention, the switching "off" of the complementary device may precede the switching in step 402 by a predetermined time interval, an idle period, to ensure that the supply rails are not shorted while the devices transition. With the switching to state "I", the driven transistor of pair 302a and 302b, FIG. 3, forms a current mirror with the corresponding one of transistors 304a and 304b.

In the current mirror configuration, the amplifier transistors operate in the saturation region of the MOSFET drain-source characteristic, and common node (node 303, FIG. 3) is pulled up or down, depending on the input data, "high" or "low", respectively. The rate at which the node transitions is determined by the current mirror current source (307a and 307b, FIG. 3) and the ratio of the sizes of the driver transistor, and the mirror reference transistor, that is, the ratio of sizes of transistor pair 302a and 304a and 302b and 304b, FIG. 3 (that is the mirror current) and the current in inductor 318. The rate at which the common node transitions is a function of the algebraic sum of the mirror current and current in inductor 318, which sum may be bounded by the maximum design load current, in accordance with the present inventive principles.

This may be further understood by referring now to FIG. 5.1, which schematically depicts a curve of the voltage of the common node as a function of time. FIG. 5.1, represents the normal case, in which an overcurrent condition is not presented at the output node of the driver transistors, node 303, FIG. 3. It is assumed, for illustrative purposes, that the input data is going "low", and the pull down transistor, 302a in FIG. 1, is turning on. (It would be understood by the ordinarily skilled artisan that the complementary phase, in which the input data is going "high" and the pull up transistor switching on, would have a voltage-time curve that is essentially the complement of that shown in FIG. 5.1.) Time $t_I$ corresponds to the switching from "off" to "I", step 402, FIG. 4. The common node voltage is pulled down at during, portion 502, FIG. 5.1, at a rate determined by the relative sizes of the amplifier transistor 302a, FIG. 3 and the mirror reference, transistor 304a, FIG. 3, the current source 307a, the current in inductor 318, and the parasitic capacitance (not shown in FIG. 3) at the common node. A typical size ratio of transistor 302a and 304a (also 302b and 304b) may be 100:1, and a typical current range for current source 307a (also 307b) 250 microamperes to 1 milliampere (250 µA–1 mA). However, it would be understood by artisans of ordinary skill in the art that alternative embodiments having other size ratios or current sources would fall within the spirit and scope of the present invention. The slope of portion 502 determines the slew rate of the amplifier in switching from "high" to "low".

Returning to FIG. 4, in step 406, process 400 waits for a predetermined time interval, or delay. In an embodiment of the present invention in accordance with FIG. 3, the timing of the predetermined interval may be performed by a corresponding one of delay 309a and 309b, depending on whether the common node is being pulled up or pulled down. The delay interval may be determined by the time required to discharge (or charge, if the common node is being pulled up) of the parasitic capacitance at the common node (not shown in FIG. 3). If the value of the parasitic capacitance is denoted by $C_p$, the common node current by I, and the voltage of the positive rail by $V_D$, then the time to charge or discharge the parasitic capacitance is given by $t_C = C_p V_D / I$ (as discussed above, the common node current is the algebraic sum of the mirror current and inductor current). The time $t_C$ represents a minimum delay period, and inasmuch as the parasitic capacitance at the common node is dependent upon the fabrication process, and other manufacturing uncertainties, and therefore may not be well known, a sufficient margin should be incorporated in the delay interval, to avoid false faults. For a reference current of 250 microamperes and a supply voltage of 3 volts, and a nominal parasitic capacitance of 100 picofarads (the parasitic capacitance may essentially be from diodes shunted across the amplifier transistors, as described below) the delay time may be approximately thirty nanoseconds (30 ns), using a factor of ten as the margin for the delay interval, based on a maximum design load current of approximately 100 mA. A margin of from three times to ten times may commonly be used. This delay time is sufficiently long to ensure that a false fault condition will not be detected, as discussed herein below in conjunction with step 408, and is sufficiently short that in the event of a fault, the energy dissipated by the transistors, or, in the load, is not excessive. Note that, as would be recognized by an artisan of ordinary skill, that alternative embodiments of the present invention having other size ratios, reference currents, rail voltages and fabrication processes, for example, with results in differences in the delay time, would fall within the spirit and scope of the present invention.

In step 408, the output voltage, at the common node 303, FIG. 3, is determined, and compared with a predetermined reference voltage. If the common node is being pulled down, that is the input data is low, it is determined if the output voltage has fallen below the reference voltage. In other words, generally, it is determined if the output voltage ad reference voltage satisfy a predetermined ordering relation. In an embodiment of the present invention in accordance with FIG. 3, the comparison of the output voltage and the reference, ref 311a, may be performed by comparator 310a, when the common node is being pulled down. Conversely, if the input data is high, and the common node is being pulled up, in step 408 is determined if the output voltage exceeds the reference voltage. If the output node is being pulled up, in an embodiment of the present invention in accordance with FIG. 3 the comparison of the output voltage and the reference, ref 311b, may be performed by comparator 310b. If, the output voltage is less than the reference voltage (pull down) or greater than the reference voltage (pull up), then in step 410, the corresponding driver transistor, one of transistor 302a and 302b, is switched on. (Note that an ordinarily skilled artisan would recognize that the values of ref 311a and ref 311b need not be the same.) This may be performed, in amplifier portion 300, FIG. 3 by switch 306a switching to the "on" state 316a, thereby coupling the gate of transistor 302a to the positive supply rail, when the common node is being pulled down, and conversely, switch 306b switching to the "on" state 316b, coupling the gate of transistor 302b to the negative rail, when the common node is being pulled up. Referring to FIG. 5.1, the switching of the corresponding one of transistors 302a and 302b "on" corresponds to time $t_s$.

Returning to FIG. 4, while the input data remains in the current state, low if the common node is being pulled down, or high if the common node is being pulled up, the corresponding one of the driver transistors, 302a and 302b, FIG. 3 remains switched "on", step 412. The transistor is then returned to a high impedance mode, or off state, step 414, ending the current driver cycle phase, step 418. It would be appreciated by artisans of ordinary skill that the termination of the particular phase, either the pull up phase or the pull down phase, also corresponds to the initiation of the complementary phase, although it would also be recognized by artisans of ordinary skill that the initiation of the succeeding, complementary cycle may be delayed by a time interval during which both switching transistors are turned off to ensure that the driver transistors do not short the power supplies. Thus, as previously described, an idle interval may subsist during which both driver transistors are turned off. During this idle period, the output is in as "free wheel" mode and the inductor current, such as that in inductor 318, FIG. 3, flows through a corresponding one of the diodes shunted across the driver transistors ("flyback diodes" or "clamping diodes"). (The parasitic capacitance at the common node, such as node 303, FIG. 3, arises primarily from the clamping diodes.) These flyback diodes protect the transistors, and maintain the common node potential within the supply voltage plus the diode forward voltage drop. In amplifier portion 300, FIG. 3, diodes 320a and 320b are shunted across driver transistors 302a and 302b, respectively. Diodes 320a and 320b may be Schottkey diodes, in an embodiment of the present invention.

Referring again to FIG. 5.1, the duration of the input data low state, in step 412 of FIG. 4, for the pull down phase, corresponds to the time interval between $t_s$ and $t_{off}$. The time $t_{off}$ corresponds to the switching off of the driver transistor, in step 414 of FIG. 4.

Returning to step 408, FIG. 4, if the output voltage is not, in the pull down phase, smaller than the reference voltage, or conversely in the pull up phase, not greater than the reference voltage, then a fault condition exists, and step 408 proceeds by the "No" branch. In step 416 an abort is signaled, and in step 414 the drive transistor is switched off through the end of the particular drive phase, that is pull up or pull down, in accordance with the current state, high or low, of the input data. The abort signal may be provided to the PWM, for example, to reduce the relative gain of the modulator to reduce the output current to acceptable levels until the abort condition ends. It would be understood, however, by one of ordinary skill in the art, that no action need be taken and the methodology of the present invention may continue to detect the excess current and limit the current to a value that can be sustained as described further hereinbelow.

In an overcurrent fault condition, the driver transistor, one of transistors 302a and 302b, depending on whether the common node is being pulled up or being pulled down, cannot correspondingly source or sink all of the output current, as this current exceeds the mirror current. The difference is supplied via a corresponding one of the clamping diodes, such as diodes 320a and 320b in FIG. 3. Note that if the fault condition occurs during the pull up phase, the current is supplied through diode 320a, and conversely, if the fault condition occurs during the pull down phase of the common node, the output current exceeds the current that transistor 302a can sink, and the difference is returned to the positive rail via diode 320b.

This may be understood in relation to FIG. 5.2, illustrating the output node voltage as a function of time for the pull down phase, during a fault condition. As described in conjunction with FIG. 5.1 hereinabove, at time $t_I$ the pull down driver is switched to the current mirror configuration. However, because of the overcurrent in the output node, the pull down transistor cannot sink sufficient current to pull down the common node. The difference between the current through the pull down driver and the (inductive) fault current is diverted to the positive supply rail through clamping diode 320b, FIG. 3. The common node is clamped above the positive supply rail by the forward voltage drop, $V_f$, of the clamping diode. As discussed in conjunction with FIG. 4, after the elapse of the delay time in step 406, the fault is detected in response to the voltage of the common node remaining above the reference voltage, and the corresponding driver transistor, the pull down device in this instance, is turned off at time $t_s$. The voltage at the output node then returns to the supply rail with a time determined by the L/R decay of the current in the output branch, which decay is determined predominantly by the inductance in the low pass filter, and the load resistance. In the pull down phase, a switched mode amplifier in accordance with the principles of the present invention, for example a portion 300 of a switched mode amplifier in accordance with the embodiment in FIG. 3, will detect a short circuit in which the driver output or load resistor is directly tied to the positive supply rail. Conversely, the complementary, or pull up circuit may detect a short circuit in which the driver output or load resistance is directly tied to the negative supply. Additionally, an overload condition in which the load resistance attached to the driver is too small, may also be detected.

Figure 6:
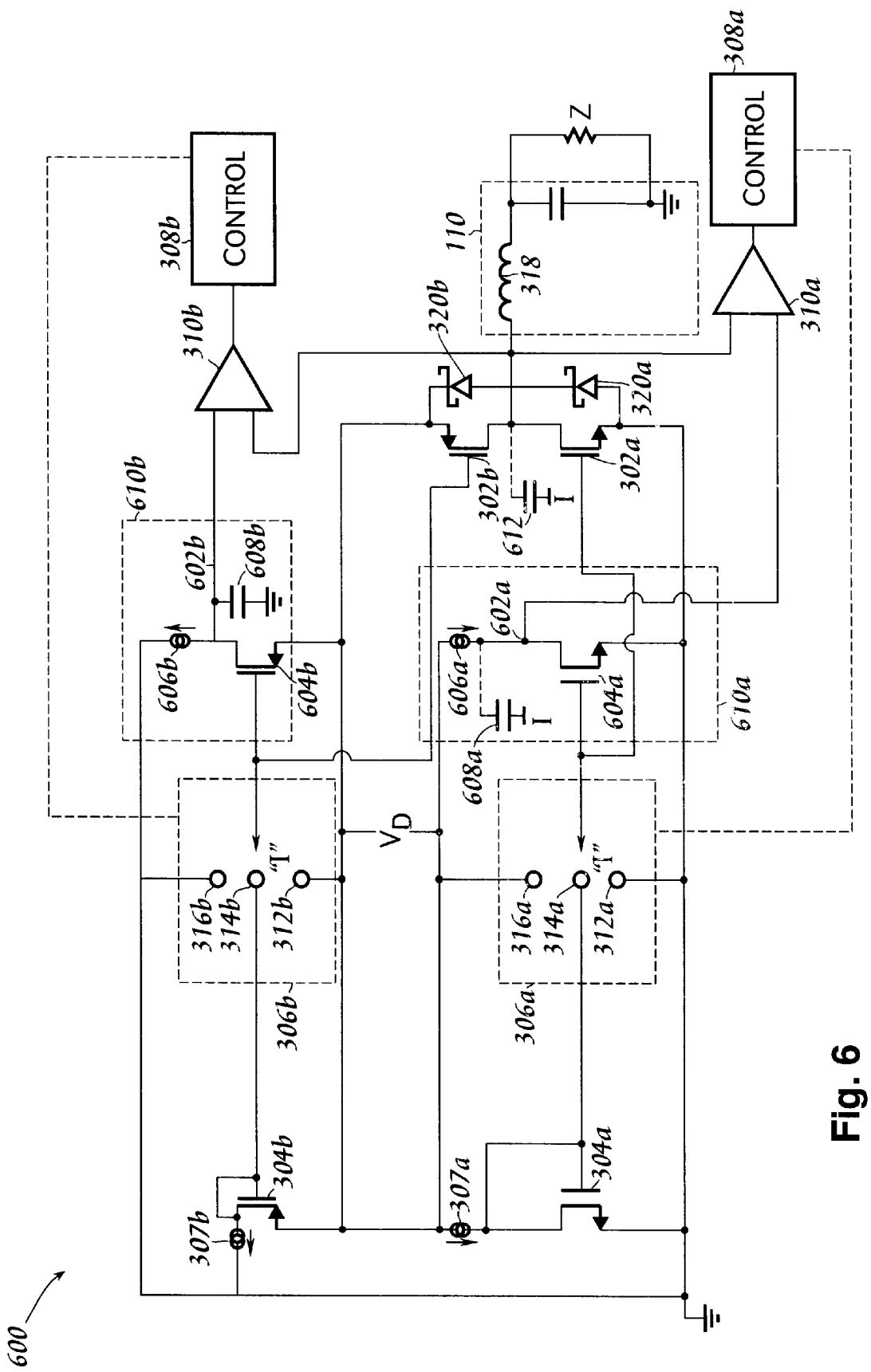
FIG. 6 illustrates, in partial schematic form, a switching amplifier in accordance with yet another embodiment of the present invention.

Refer now to FIG. 6 in which is illustrated an alternative embodiment of a portion 600 of an amplifier system in accordance with the principles of the present invention. In amplifier portion 600, the corresponding mirror reference transistors 304a and 304b are configured as in the embodiment of the present invention illustrated in FIG. 3. Similarly, switches 302a and 302b with the associated controls 308a and 308b are configured as in the embodiment of amplifier portion 300, FIG. 3. The load Z, is coupled to the output, or common node 303 via LPF 110. In amplifier portion 600, in contrast to amplifier portion 300 of FIG. 3, the voltage at the common node is compared to that at a reference node, one of reference nodes 602a and 602b, in contrast to a predetermined fixed reference value. Additionally, as will be discussed in conjunction with FIG. 7 hereinbelow, the comparison with the reference nodes, 602a and 602b is made continuously (without needing a delay before making the comparison during "I" mode) throughout the corresponding one of the pull up phase and pull down phase of a driver cycle.

Reference node 602a constitutes the junction of transistor 604a and current source 606a. The source of transistor 604a is connected in parallel with the source of transistor 302a, and the gate of transistor 604a is connected in parallel with the gate of transistor 302a. Capacitor 608a is connected between reference node 602a and the negative supply rail.

Transistor 604b, current source 606b and capacitor 608b are similarly connected in the pull up branch of amplifier portion 600. Thus, the source of transistor 604b is connected in parallel with the source of transistor 302b and the gate of transistor 604b is connected in parallel with the gate of 302b. Transistor 604a, current source 606a and, capacitor 608a provide a pull down switching reference 610a, and transistor 604b, current source 606b and capacitor 608b form a pull up switching reference 610b. These are scaled with respect to the pull down driver, transistor 302a, pull up driver, transistor 302b and output node capacitance 612. Output node capacitance 612, which is explicitly illustrated in FIG. 6, is principally parasitic capacitance at output node 303, and thus is illustrated in FIG. 6 as being coupled to output node 303 by a dashed line. The size ratio of transistor 604a and 604b with respect to transistors 302a and 302b, respectively, may be 1:100, however, other size ratios may be used in alternative embodiments, and such embodiments would be within the spirit and scope of the present invention. Current sources 606a and 606b stand in a similar ratio with respect to a predetermined short circuit current in output node 303. Thus, in an embodiment in which the reference transistors, 604a and 604b, are one hundred times smaller than the driver transistors, current sources 606a and 606b are also one hundred times smaller than the selected short circuit current in output node 303. For example, if current sources 606a and 606b are three milliamperes (3 ma) and for a size ratio of 1:100, the overcurrent limit will be three hundred milliamperes (300 ma). It would be understood by ordinarily skilled artisans that these value are exemplary, and other embodiments having different values would fall within the spirit and scope of the present invention.

Capacitors 608a and 608b are similarly scaled with respect to parasitic capacitance 612. However, the values of capacitor 608a and 608b may not need to be closely matched to the scaled value of the parasitic capacitance at the output node. The values of capacitors 608a and 608b may be equal to or greater than the value of parasitic capacitor 612, divided by the size ratio of reference transistors 604a and 604b, respectively, and the corresponding ones of driver transistors 302a and 302b. This ensures that the output current of amplifier portion 600 is at least as large as the value of current sources 602a and 602b, multiplied by the size ratio of the driver transistors to the reference transistors, when the corresponding reference node transitions faster than the output node 303. The operation of amplifier portion 600 may be further understood by referring now to FIG. 7.

Figure 7:
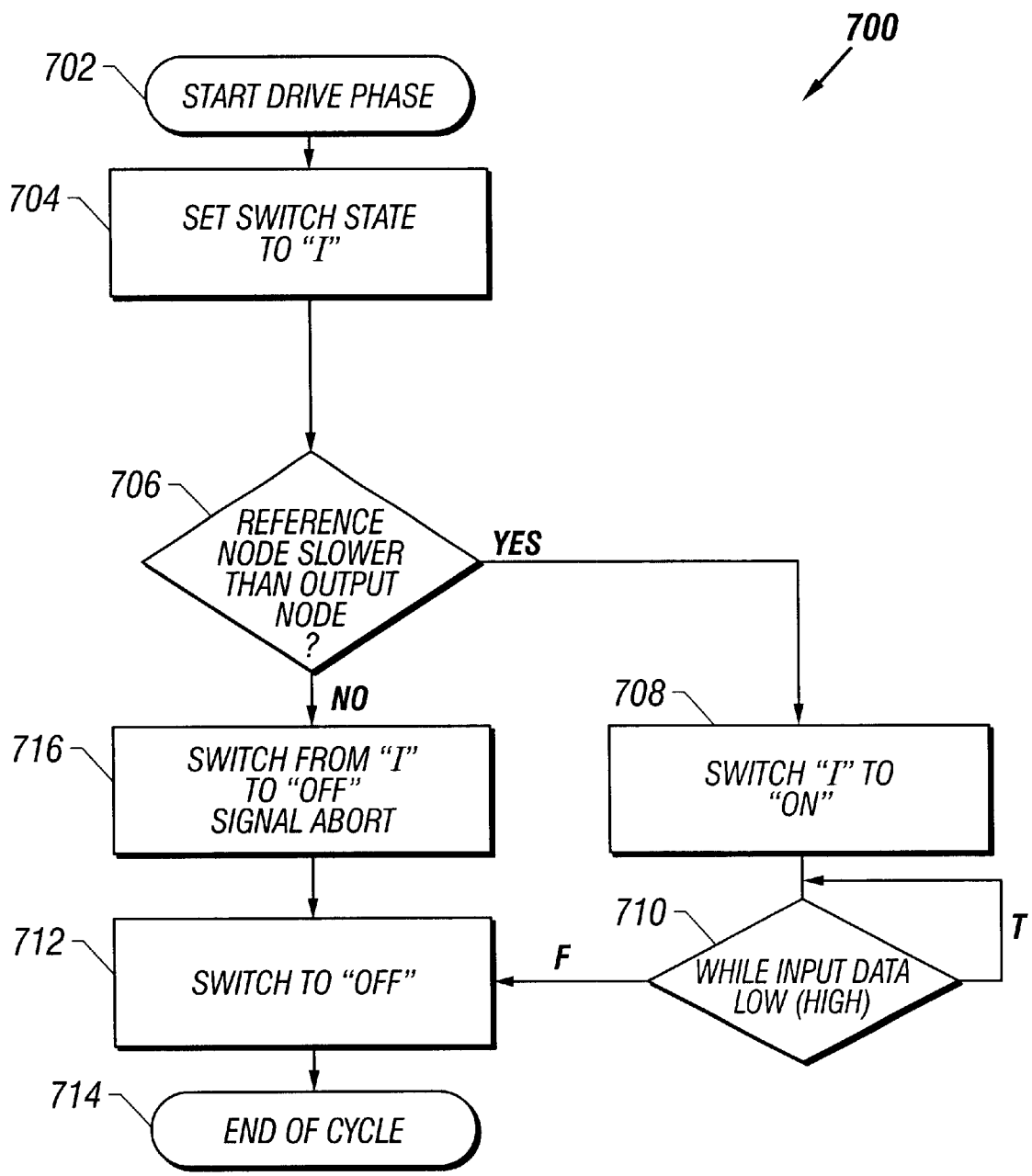
FIG. 7 illustrates, in flow chart form, a driving methodology in accordance with the switching amplifier embodiment of FIG. 6.

FIG. 7 illustrates, in flowchart form, driver process 700 in accordance with an embodiment of the present invention. Note that process 700 may be performed by the pull down branch during the "low" phase of the PWM input data, and similarly may be performed by the pull up branch during the "high" phase of the PWM input data (with the corresponding parameters indicated in the specific steps of the process). Process 700 starts, for a particular phase of the PWM signal cycle, step 702 when the input data transitions to the corresponding state, "high" for the pull up phase or "low" for the pull down phase. In step 704, the state of the switch, the one of switches 306a and 306b, FIG. 6, in accordance the input data state, is set to "I", 314a/314b. The corresponding one of transistors 304a/304b and the associated current sources 306a/306b form current mirrors with the corresponding ones of transistors 604a/604b and transistors 302a/302b. The active reference node, the corresponding one of nodes 602a and 602b, as well as output node 303 then switch at a rate determined by the capacitance at the respective node and the mirror current, as previously described in conjunction with FIGS. 4 and 5.

In step 706, it is determined if the reference node transitions slower than the output node. In an embodiment of the present invention in accordance with amplifier portion 600, FIG. 6, this may be performed by the corresponding ones of switching reference 610a, comparator 310a and control 308a, and switching reference 610b, comparator 310b and control 308b. As described hereinabove, the sizing of switching references 610a and 610b is such that the corresponding reference node transitions slower than output node 303 if the output current does not exceed the predetermined maximum output current. That is, for example, in the pull down phase, reference node 602a will be pulled down more slowly than driver transistor 302a pulls down output node 303. Conversely, in the pull up phase, reference node 602b will be pulled up more slowly than output node 303 is pulled up by driver transistor 302b. Comparators 310a and 310b compare the voltages at the corresponding one of reference nodes 602a and 602b with the voltage at output node 303. Thus, the state of the output of the corresponding one of comparators 310a and 310b represents the relative rate of transition of the corresponding reference node, 602a or 602b, and output node 303.

Thus returning to FIG. 7, step 706, if there is no fault condition at the output node, the reference node transition is slower than the output node, and in step 708, the corresponding one of switches 306a and 306b, switches from the current mirror state, 314a or 314b (in the pull down phase or pull up phase, respectively), to the "on" state, the corresponding one of states 316a and 316b. The corresponding switch remains in the "on" state while the input data remains in the corresponding state, low if in the pull down phase, or high if in the pull up phase, step 710. On change of state of the input data, the driver transistor is switched off, step 712, the corresponding one of switches 306a or 306b switching to the "off" state, 312a or 312b, in accordance with the corresponding input data state, and in step 714 the current phase, pull down or pull up, terminates. Recall, as discussed hereinabove in conjunction with FIG. 4, that there may be a idle interval during which both driver transistors are turned off, before the next cycle begins.

Returning to step 706, if an overcurrent fault exists at the output node, the reference node, one of node 602a and 602b in accordance with the current input data state, transitions faster than the switching of the output node by the respective one of driver transistors 302a and 302b. Step 706 then proceeds by the "No" branch and in step 714 an abort is signaled, and the corresponding driver transistor switched off, step 710, as previously discussed, and remains off through the end of the current cycle, step 712. Note, that in an alternative embodiment in accordance with the principles of the invention illustrated in FIG. 7, the driver transistor may be maintained in the current mirror configuration, as this configuration limits the current through the drive transistor to safe levels. In such an embodiment, process 700, as illustrated in FIG. 7 would be modified such that the driver is maintained in the current mirror configuration via the corresponding one of switches 306a and 306b, FIG. 6, and process 700 proceeds directly from step 714 to step 712. In other words, in such an alternative embodiment, step 710 is bypassed following step 714.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed:

1. A switched-mode amplifier current control apparatus comprising:

a driver amplifier configurable for selective operation in a first, second and third operating mode; and a bias circuitry configured for selective coupling to said driver amplifier, said bias circuitry operable for limiting an output current of said driver amplifier in said first operating mode, and wherein said driver amplifier is operable for transitioning from said first operating mode to a selected one of said second and third operating modes in response to a state of an output node of said driver amplifier.

2. The apparatus of claim 1 further comprising a switching circuitry coupled to said bias circuitry, wherein said switching circuitry, in a first state, couples said bias circuitry to said switching amplifier.

3. The apparatus of claim 2 wherein said switching circuitry, in a second state, couples said switching amplifier to a first supply voltage, and in a third state, couples said switching amplifier to a second supply voltage.

4. The apparatus of claim 3 wherein, said driver amplifier includes a pull-up device and a pull-down device, and wherein, in said second state, a first one of said pull-up device and said pull-down device is placed in said second operating mode and a complementary one of said pull-up device and said pull-down device is placed in said third operating mode, and in said third state, the complementary one of said pull-up device and said pull-down device is placed in said third operating mode and the first one of said pull-up device and said pull-down device is placed in said second operating mode.

5. The apparatus of claim 3 further comprising:
a reference signal;
a comparator having a first input coupled to said reference signal and a second input coupled to an output node of said driver amplifier;
a control circuitry coupled to an output of said comparator, said control circuitry selecting said second state in response to a value of said output of said comparator and a predetermined timing condition.

6. The apparatus of claim 5 wherein said reference signal comprises a predetermined reference voltage.

7. The apparatus of claim 5 further comprising reference circuitry, and wherein said reference signal comprises a signal at a reference node of said reference circuitry.

8. The apparatus of claim 7 wherein said reference node comprises a junction of a current source, a drain of a field effect transistor (FET), and a capacitor.

9. The apparatus of claim 5 wherein said predetermined timing condition comprises an expiry of a predetermined delay.

10. The apparatus of claim 5 wherein said predetermined timing condition comprises a relative transition rate between a reference node and said output node of said driver amplifier.

11. The apparatus of claim 2 wherein, in said first state, said bias circuit and said driver amplifier form a current mirror.

12. A current control method comprising the steps of:
switching a bias circuit operable for limiting an output current of an amplifier to an input of said amplifier; and
determining if a voltage at an output node of said amplifier satisfies a predetermined condition.

13. The method of claim 12 further comprising the step of, if said predetermined condition is satisfied, switching on a selected one of a pull-up device and a pull-down device in said one of said pull-up device and said pull-down device selected in response to a value of an input signal.

14. The method of claim 13 further comprising the step of, if said predetermined condition is not satisfied, switching off a selected one of said pull-up device and said pull-down device said one of said pull-up device and said pull-down device selected in response to said value of said input signal.

15. The method of claim 12 wherein said predetermined condition comprises, after an expiry of a predetermined delay, said voltage at said output node having a selected ordering relation with a reference voltage, said ordering relation selected in response to a value of an input signal.

16. The method of claim 15 wherein said ordering relation comprises:
if said value of said input signal is a first value, said voltage at said output node is less than a first reference signal; and
if said value of said input signal is a second value, said voltage at said output node is greater than a second reference signal.

17. The method of claim 12 wherein said predetermined condition comprises, a transition rate of said output node exceeds a transition rate of a reference node.

18. The method of claim 17 wherein said reference node comprises a node of a current source, a drain of a field effect transistor (FET) and a capacitor.

19. An amplifier system comprising:
a digital signal source;
a driver amplifier configurable for selective operation in a first, second and third operating mode; and
a bias circuitry configured for selective coupling to said driver amplifier, said bias circuitry operable for limiting an output current of said driver amplifier in said first operating mode, and wherein said driver amplifier is operable for transitioning from said first operating mode to a selected one of said second and third operating modes in response to a state of an output node of said driver amplifier; and
a pulse width modulator coupled to said digital signal source, an output of said pulse width modulator controlling a duty cycle of said driver amplifier.

20. The system of claim 19 further comprising a switch configured for coupling said bias circuitry to said driver amplifier wherein said switch, in a first state, couples said bias circuitry to said switching amplifier.

21. The system of claim 20 wherein, in said first state, said bias circuit and said driver amplifier form a current mirror.

22. The system of claim 19 wherein said switch, in a second state, couples said switching amplifier to a first supply reference voltage, and in a third state, couples said switching amplifier to a second supply reference voltage.

23. The system of claim 22 wherein, said driver amplifier includes a pull-up device and a pull-down device, and wherein, in said second state, a first one of said pull-up device and said pull-down device is turned on and a complementary one of said pull-up device and said pull-down device is turned off, and in said third state, a the complementary one of said pull-up device and said pull-down device is turned on and the first one of said pull-up device and said pull-down device is turned off.

24. The system of claim 22 further comprising:
a reference signal;
a comparator having a first input coupled to said reference signal and a second input coupled to an output node of said driver amplifier;
control circuitry coupled to an output of said comparator, said control circuitry selecting said second state in response to a value of said output of said comparator and a predetermined timing condition.

25. The system of claim 24 wherein said reference signal comprises a predetermined reference voltage.

26. The system of claim 24 further comprising reference circuitry, and wherein said reference signal comprises a signal at a reference node of said reference circuitry.

27. The system of claim 26 wherein said reference node comprises a junction of a current source, a drain of a field effect transistor (FET), and a capacitor.

28. The system of claim 24 wherein said predetermined timing condition comprises an expiry of a predetermined delay.

29. The system of claim 24 wherein said predetermined timing condition comprises a relative transition rate between a reference node and said output node of said driver amplifier.

30. A switched-mode amplifier comprising:

a driver amplifier having an output transistor; and a switch coupled to the output transistor, the switch operable for switching between first, second and third states and wherein, in the first state, the output transistor is on, in the second state, the output transistor is off, and, in the third state, the output transistor is in an intermediate state between on and off.

31. The switched-mode amplifier of claim 30 wherein the switch switches between the second state and the third state to initiate a turn-on of the output transistor and switches from the third state to the first state in response to a monitor coupled to an output node of the output transistor.

32. The switched-mode amplifier of claim 31 wherein the monitor coupled to the output node senses output voltage.

33. The switched-mode amplifier of claim 30 wherein the intermediate state comprises a saturation region of a MOSFET drain-source characteristic.

* * * * *